United States Patent
Yee et al.

(10) Patent No.: US 8,847,413 B2
(45) Date of Patent: Sep. 30, 2014

(54) INTEGRATED CIRCUIT PACKAGE SYSTEM WITH LEADS HAVING MULTIPLE SIDES EXPOSED

(75) Inventors: Jae Hak Yee, Shanghai (CN); Byoung Wook Jang, Yong-in (KR)

(73) Assignee: STATS ChipPAC Ltd., Singapore (SG)

( * ) Notice: Subject to any disclaimer, the term of this patent is extended or adjusted under 35 U.S.C. 154(b) by 1152 days.

(21) Appl. No.: 12/014,578

(22) Filed: Jan. 15, 2008

(65) Prior Publication Data
US 2008/0171405 A1    Jul. 17, 2008

Related U.S. Application Data

(60) Provisional application No. 60/884,999, filed on Jan. 15, 2007.

(51) Int. Cl.
| | | |
|---|---|---|
| H01L 31/0203 | (2014.01) | |
| H01L 23/495 | (2006.01) | |
| H01L 21/56 | (2006.01) | |
| H01L 23/31 | (2006.01) | |
| H01L 25/03 | (2006.01) | |
| H01L 25/065 | (2006.01) | |
| H01L 25/10 | (2006.01) | |
| H01L 23/00 | (2006.01) | |

(52) U.S. Cl.
CPC ...... *H01L 23/49575* (2013.01); *H01L 31/0203* (2013.01); *H01L 21/568* (2013.01); *H01L 23/3107* (2013.01); *H01L 23/3128* (2013.01); *H01L 23/3135* (2013.01); *H01L 23/49548* (2013.01); *H01L 24/45* (2013.01); *H01L 24/97* (2013.01); *H01L 25/03* (2013.01); *H01L 25/0657* (2013.01); *H01L 25/105* (2013.01); H01L 2224/45124 (2013.01); H01L 2224/45144 (2013.01); H01L 2224/48091 (2013.01); H01L 2224/48247 (2013.01); H01L 2224/97 (2013.01); H01L 2225/0651 (2013.01); H01L 2225/06562 (2013.01); H01L 2924/01013 (2013.01); H01L 2924/01029 (2013.01); H01L 2924/01046 (2013.01); H01L 2924/01079 (2013.01); H01L 2924/01082 (2013.01); H01L 2924/14 (2013.01); H01L 2924/15311 (2013.01); *H01L 24/48* (2013.01); H01L 2924/01033 (2013.01); H01L 2924/01028 (2013.01); H01L 2225/1029 (2013.01); H01L 2225/1052 (2013.01); H01L 2924/3511 (2013.01); H01L 2924/12041 (2013.01)
USPC ........... 257/788; 257/660; 257/678; 257/687; 257/685

(58) Field of Classification Search
CPC ............................. H01L 25/03; H01L 31/0203
USPC .................................................. 257/788, 729
See application file for complete search history.

(56) References Cited

U.S. PATENT DOCUMENTS

| | | | | |
|---|---|---|---|---|
| 5,291,061 A | * | 3/1994 | Ball | 257/686 |
| 5,585,668 A | * | 12/1996 | Burns | 257/676 |
| 5,939,779 A | | 8/1999 | Kim | |
| 6,075,284 A | | 6/2000 | Choi et al. | |

(Continued)

*Primary Examiner* — Julio J Maldonado
*Assistant Examiner* — Mohammad Choudhry
(74) *Attorney, Agent, or Firm* — Ishimaru & Associates LLP

(57) ABSTRACT

An integrated circuit package system includes forming an integrated circuit stack having a bottom non-active side and a top non-active side; connecting an internal interconnect between a lead, having a top side and a bottom side, and the integrated circuit stack; and forming an encapsulation, having both a non-elevated portion and an elevated portion, around the integrated circuit stack and the internal interconnect with the top side exposed at the non-elevated portion, and with the bottom side, the bottom non-active side, and the top non-active side exposed.

20 Claims, 4 Drawing Sheets

(56) References Cited

U.S. PATENT DOCUMENTS

| | | |
|---|---|---|
| 6,337,510 B1 | 1/2002 | Chun-Jen et al. |
| 6,723,585 B1 | 4/2004 | Tu et al. |
| 7,045,396 B2 | 5/2006 | Crowley et al. |
| 2007/0114641 A1* | 5/2007 | Goh et al. .................... 257/676 |
| 2008/0029866 A1 | 2/2008 | Kim et al. |
| 2008/0029867 A1 | 2/2008 | Kim et al. |
| 2008/0029868 A1 | 2/2008 | Lee et al. |
| 2008/0157302 A1* | 7/2008 | Lee et al. .................... 257/676 |

\* cited by examiner

INTEGRATED CIRCUIT PACKAGE SYSTEM WITH LEADS HAVING MULTIPLE SIDES EXPOSED

CROSS-REFERENCE TO RELATED APPLICATION

This application claims the benefit of U.S. Provisional Patent Application Ser. No. 60/884,999 filed Jan. 15, 2007.

TECHNICAL FIELD

The present invention relates generally to integrated circuit package systems, and more particularly to a system for integrated circuit package systems having stacked packages.

BACKGROUND ART

To interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density.

However, integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

This need for increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of one or more substrates onto each of which one or more integrated circuit components is directly attached. Such multi-chip packages have been found to increase integrated circuit density and miniaturization, improve signal propagation speed, reduce overall integrated circuit size and weight, improve performance, and lower costs—all primary goals of the computer industry.

There is always a limitation on the number of die that can be stacked in a package, especially for big memory dice. Same die stacking with all bond pads at one side allows stacking in the staircase manner that eliminates the need for thick spacers between the dice. However, stacking is still restricted by the package size where over-stacking cause die protrusion requiring extra long packages.

Thus, a need still remains for improved packaging methods, systems, and designs. In view of the shrinking size of consumer electronics and the demand for more sophisticated functions in the restricted space, it is increasingly critical that answers be found to these problems. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

Disclosure of the Invention

The present invention provides an integrated circuit package system that includes forming an integrated circuit stack having a bottom non-active side and a top non-active side; connecting an internal interconnect between a lead, having a top side and a bottom side, and the integrated circuit stack; and forming an encapsulation, having both an non-elevated portion and an elevated portion, around the integrated circuit stack and the internal interconnect with the top side exposed at the non-elevated portion, and with the bottom side, the bottom non-active side, and the top non-active side exposed.

Certain embodiments of the invention have other aspects in addition to or in place of those mentioned above. The aspects will become apparent to those skilled in the art from a reading of the following detailed description when taken with reference to the accompanying drawings.

BEST MODES FOR CARRYING OUT THE INVENTION

Figure 1:
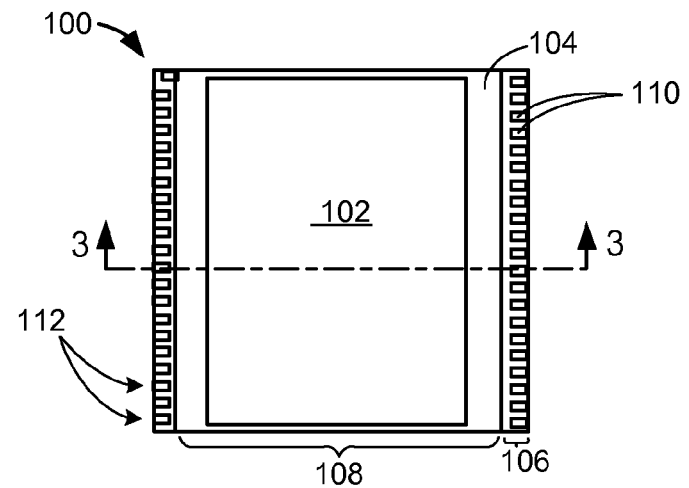
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation. The terms first, second, and third embodiments are used merely as a convenience and do not have any other significance.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention, as appropriate and as evident from context. The term "processing" as used herein includes stamping, forging, patterning, exposure, development, etching, cleaning, and/or removal of the material or laser trimming as required in forming a described structure.

Referring now to FIG. 1, therein is shown a top view of an integrated circuit package system 100 in a first embodiment of the present invention. The top view depicts a top integrated circuit die 102 exposed by an encapsulation 104, such as a cover of an epoxy molding compound. The top integrated circuit die 102 is shown not centered relative to the integrated circuit package system 100, as an example. The encapsulation 104 includes a non-elevated portion 106 and an elevated portion 108. The non-elevated portion 106 exposed a top side 110 of leads 112. The top side 110 of the leads 112 does not extend to the edge of the encapsulation 104, as an example.

For illustrative purposes, the integrated circuit package system 100 is shown with the leads 112 at opposite sides, although it is understood that the integrated circuit package system 100 can have the leads 112 in different configurations. For example, the leads 112 may be along all the sides, some of the sides, or one side of the integrated circuit package system 100. As another example, the integrated circuit package system 100 may have multiple rows of the leads 112.

Figure 2:
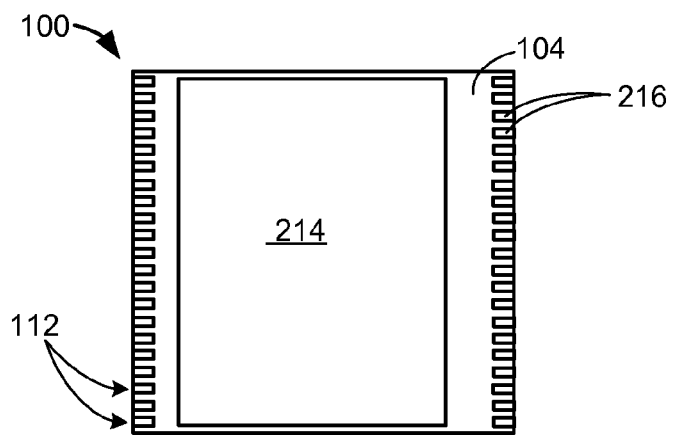
FIG. 2 is a bottom view of the integrated circuit package system of FIG. 1.

Referring now to FIG. 2, therein is shown a bottom view of the integrated circuit package system 100 of FIG. 1. The bottom view depicts a bottom integrated circuit die 214 exposed by the encapsulation 104. The bottom integrated circuit die 214 is shown not centered relative to the integrated circuit package system 100, as an example. The encapsulation 104 exposes a bottom side 216 of the leads 112. The bottom side 216 of the leads 112 extends to the edge of the encapsulation 104, as an example.

Figure 3:
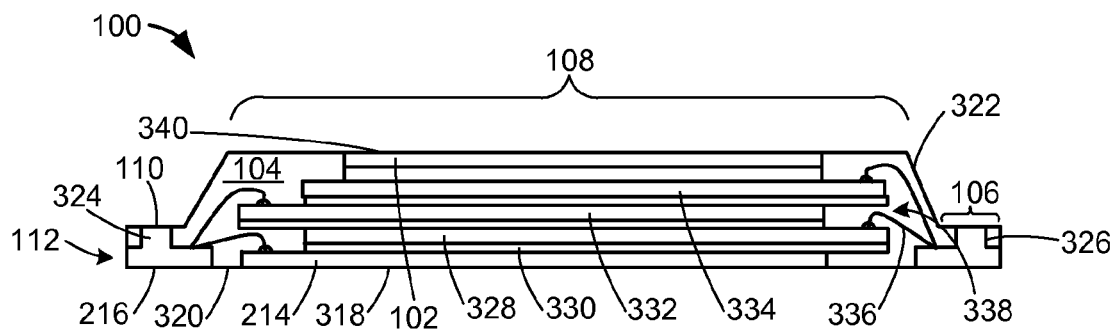
FIG. 3 is a cross-sectional view of the integrated circuit package system along 3-3 of FIG. 1.

Referring now to FIG. 3, therein is shown a cross-sectional view of the integrated circuit package system 100 along 3-3 of FIG. 1. The cross-sectional view depicts a bottom non-active side 318 of the bottom integrated circuit die 214 substantially coplanar with the bottom side 216 of the leads 112 and a bottom surface 320 of the encapsulation 104. A top surface 322 of the encapsulation 104 includes the non-elevated portion 106 and the elevated portion 108. The leads 112 include a protrusion 324 having the top side 110 exposed at the non-elevated portion 106 of the encapsulation 104. Sides 326 of the protrusion 324 are surrounded by the encapsulation 104 allowing the leads 112 to function as a mold interlock thereby improving reliability, such as in moisture sensitivity level (MSL) performance.

A first integrated circuit die 328 can be over the bottom integrated circuit die 214 in an offset configuration. An adhesive 330, such as a die-attach adhesive, is between the bottom integrated circuit die 214 and the first integrated circuit die 328. A second integrated circuit die 332 can be over the first integrated circuit die 328 in an offset configuration in a similar direction to the bottom integrated circuit die 214. A third integrated circuit die 334 can be over the second integrated circuit die 332 in an offset configuration in a similar direction to the first integrated circuit die 328. The top integrated circuit die 102 can be over the third integrated circuit die 334.

The adhesive 330 is also between the first integrated circuit die 328 and the second integrated circuit die 332, the second integrated circuit die 332 and the third integrated circuit die 334, and the third integrated circuit die 334 and the top integrated circuit die 102. Internal interconnects 336, such as bond wires or ribbon bond wires, connect the bottom integrated circuit die 214, the first integrated circuit die 328, the second integrated circuit die 332, and the third integrated circuit die 334 with the leads 112.

The encapsulation 104 covers an integrated circuit stack 338 of the bottom integrated circuit die 214, the first integrated circuit die 328, the second integrated circuit die 332, the third integrated circuit die 334, and the top integrated circuit die 102 with the bottom non-active side 318 and a top non-active side 340 of the top integrated circuit die 102 exposed. The encapsulation 104 also covers the internal interconnects 336 and the leads 112 with the top side 110 and the bottom side 216 exposed. The elevated portion 108 of the encapsulation 104 is above the height of the protrusion 324 of the leads 112.

The integrated circuit stack 338 can serve to provide mechanical rigidity for the integrated circuit package system 100. The offset configuration of the integrated circuit stack 338 may also function as a mold interlock for the integrated circuit package system 100.

For illustrative purposes, the integrated circuit stack 338 includes an offset configuration of the integrated circuit dice such that the integrated circuit dice or the adhesive 330 do not interfere with the connections of the internal interconnects 336, although it is understood that the bottom integrated circuit die 214, the first integrated circuit die 328, the integrated circuit stack 338 may be stacked differently. For example, the integrated circuit stack 338 can include a spacer, such as a wire-in-film, as the adhesive 330 within the integrated circuit stack 338 allowing the internal interconnects 336 to connect to one or more of the integrated circuit dice within the spacer.

Also for illustrative purposes, the integrated circuit package system 100 is shown with the top integrated circuit die 102, although it is understood that the integrated circuit package system 100 can have a different structure. For example, the top integrated circuit die 102 can represent a dummy semiconductor structure that is not an integrated circuit for providing clearance of the internal interconnects 336 attached with the third integrated circuit die 334 and for providing structural support to resist warpage.

Figure 4:
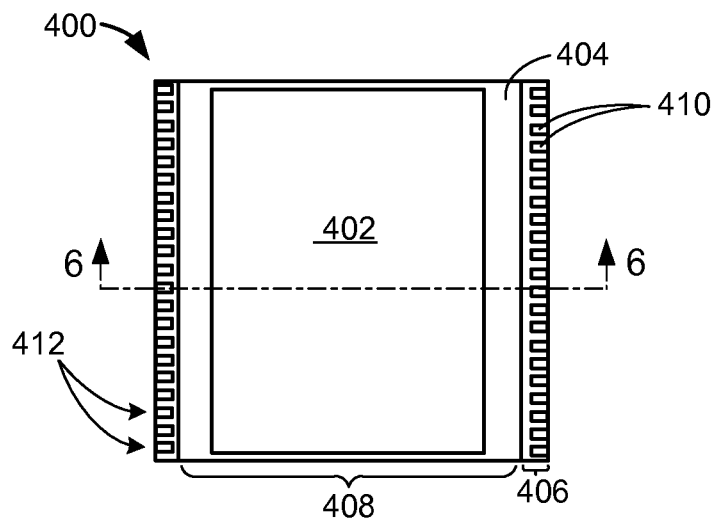
FIG. 4 is a top view of an integrated circuit package system in a second embodiment of the present invention.

Referring now to FIG. 4, therein is shown a top view of an integrated circuit package system 400 in a second embodiment of the present invention. The top view depicts a top integrated circuit die 402 exposed by an encapsulation 404, such as a cover of an epoxy molding compound. The top integrated circuit die 402 is shown not centered relative to the integrated circuit package system 400, as an example. The encapsulation 404 includes a non-elevated portion 406 and an elevated portion 408. The non-elevated portion 406 exposed a top side 410 of leads 412. The leads 412 extend to the edge of the encapsulation 404, as an example.

For illustrative purposes, the integrated circuit package system 400 is shown with the leads 412 at opposite sides, although it is understood that the integrated circuit package system 400 can have the leads 412 in different configurations. For example, the leads 412 may be along all the sides, some of the sides, or one side of the integrated circuit package system 400. As another example, the integrated circuit package system 400 may have multiple rows of the leads 412.

Figure 5:
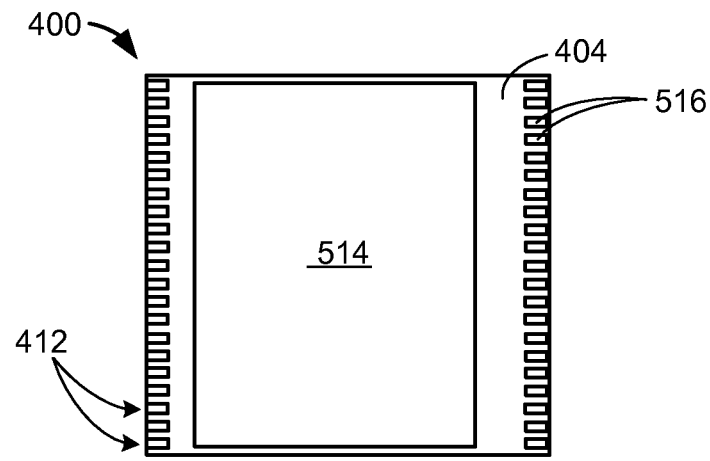
FIG. 5 is a bottom view of the integrated circuit package system of FIG. 4.

Referring now to FIG. 5, therein is shown a bottom view of the integrated circuit package system 400 of FIG. 4. The bottom view depicts a bottom integrated circuit die 514 exposed by the encapsulation 404. The bottom integrated circuit die 514 is shown not centered relative to the integrated circuit package system 400, as an example. The encapsulation 404 exposes a bottom side 516 of the leads 412.

Figure 6:
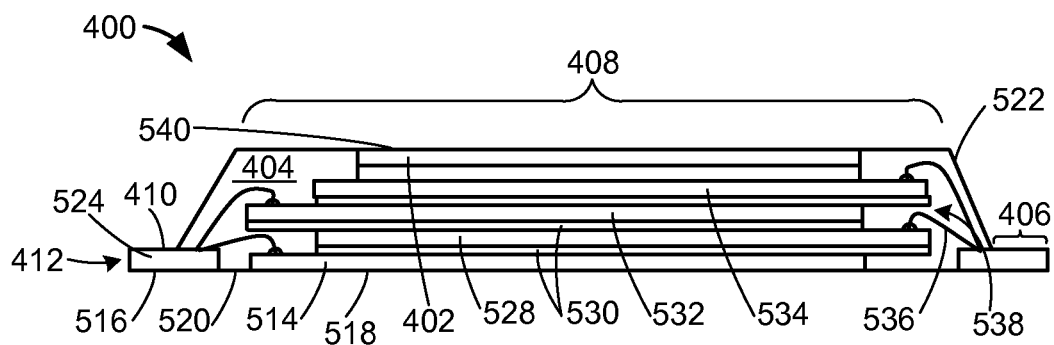
FIG. 6 is a cross-sectional view of the integrated circuit package system along 6-6 of FIG. 4.

Referring now to FIG. 6, therein is shown a cross-sectional view of the integrated circuit package system 400 along 6-6 of FIG. 4. The cross-sectional view depicts a bottom non-active side 518 of the bottom integrated circuit die 514 substantially coplanar with the bottom side 516 of the leads 412 and a bottom surface 520 of the encapsulation 404. A top surface 522 of the encapsulation 404 includes the non-elevated portion 406 and the elevated portion 408. The top side 410 of the leads 412 is also shown as coplanar with the non-elevated portion 406 of the encapsulation 404, as an example.

A first integrated circuit die 528 can be over the bottom integrated circuit die 514 in an offset configuration. An adhesive 530, such as a die-attach adhesive, is between the bottom integrated circuit die 514 and the first integrated circuit die 528. A second integrated circuit die 532 can be over the first integrated circuit die 528 in an offset configuration in a similar direction to the bottom integrated circuit die 514. A third integrated circuit die 534 can be over the second integrated circuit die 532 in an offset configuration in a similar direction to the first integrated circuit die 528. The top integrated circuit die 402 can be over the third integrated circuit die 534.

The adhesive 530 is also between the first integrated circuit die 528 and the second integrated circuit die 532, the second integrated circuit die 532 and the third integrated circuit die 534, and the third integrated circuit die 534 and the top integrated circuit die 402. Internal interconnects 536, such as bond wires or ribbon bond wires, connect the bottom integrated circuit die 514, the first integrated circuit die 528, the second integrated circuit die 532, and the third integrated circuit die 534 with the leads 412.

The encapsulation 404 covers an integrated circuit stack 538, wherein the integrated circuit stack 538 includes the bottom integrated circuit die 514, the first integrated circuit die 528, the second integrated circuit die 532, the third integrated circuit die 534, and the top integrated circuit die 402 with the bottom non-active side 518 and a top non-active side 540 of the top integrated circuit die 402 exposed. The encapsulation 404 also covers the internal interconnects 536 and the leads 412 with the top side 410 and the bottom side 516 exposed. The height of the elevated portion 408 of the encapsulation 404 is above the height of a protrusion 524 of the leads 412.

The integrated circuit stack 538 can serve to provide mechanical rigidity for the integrated circuit package system 400. The offset configuration of the integrated circuit stack 538 may also function as a mold interlock for the integrated circuit package system 400.

For illustrative purposes, the integrated circuit stack 538 includes an offset configuration of the integrated circuit dice such that the integrated circuit dice or the adhesive 530 do not interfere with the connections of the internal interconnects 536, although it is understood that the bottom integrated circuit die 514, the first integrated circuit die 528, the integrated circuit stack 538 may be stacked differently. For example, the integrated circuit stack 538 can include a spacer, such as a wire-in-film, as the adhesive 530 within the integrated circuit stack 538 allowing the internal interconnects 536 to connect to one or more of the integrated circuit dice within the spacer.

Figure 7:
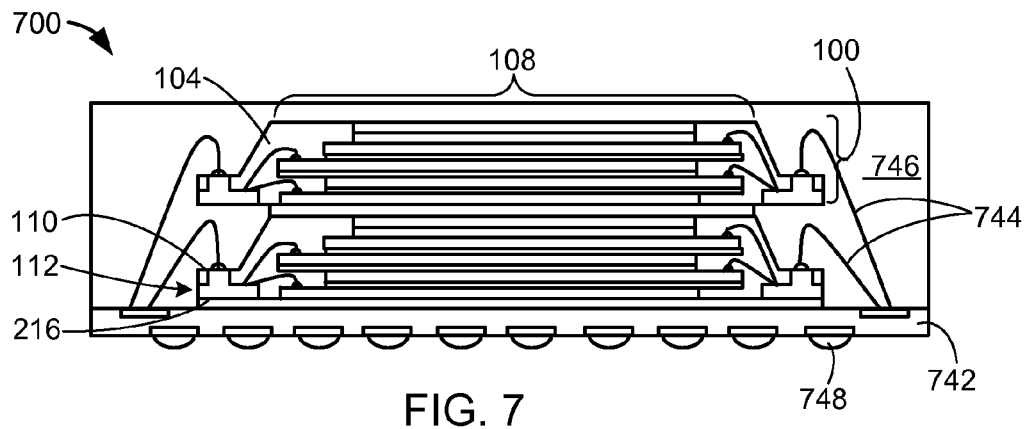
FIG. 7 is a cross-sectional view of an integrated circuit package system in a third embodiment of the present invention.

Referring now to FIG. 7, therein is shown a cross-sectional view of an integrated circuit package system 700 in a third embodiment of the present invention. The integrated circuit package system 700 is an integrated circuit package-in-package system with a stack having the integrated circuit package system 100 mounted over a carrier 742, such as a substrate.

The elevated portion 108 of the encapsulation 104 functions as a spacer allowing package interconnects 744, such as bond wires or ribbon bond wires, to connect to the top side 110 of the leads 112 and the carrier 742. This eliminates the need for separate or discrete spacer structures thereby reducing manufacturing complexity, reducing the package profile, and lowering cost.

A package encapsulation 746, such as a cover of an epoxy molding compound, covers the stack of the integrated circuit package system 100 and the package interconnects 744 over the carrier 742. External interconnects 748, such as solder balls, can attach to the bottom of the carrier 742 for connection to the next system level (not shown), such as a printed circuit board or another integrated circuit package system.

For illustrative purposes, the integrated circuit package system 100 adjacent to the carrier 742 is shown connected to the carrier 742 with the package interconnects 744, although it is understood that the integrated circuit package system 100 may be connected to the carrier 742 differently. For example, conductive paste (not shown), such as solder paste, may be used to connect the bottom side 216 of the leads 112 and the carrier 742 or in combination with the package interconnects 744.

Figure 8:
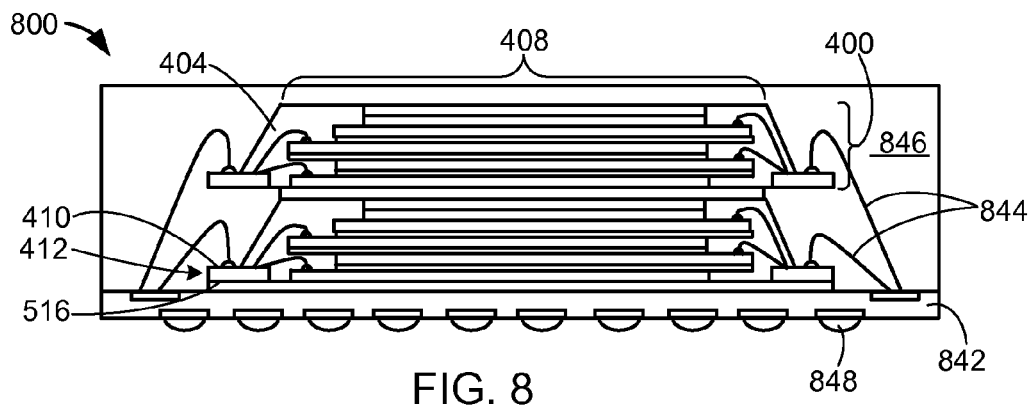
FIG. 8 is a cross-sectional view of an integrated circuit package system in a fourth embodiment of the present invention.

Referring now to FIG. 8, therein is shown a cross-sectional view of an integrated circuit package system 800 in a fourth embodiment of the present invention. The integrated circuit package system 800 is an integrated circuit package-in-package system with a stack having the integrated circuit package system 400 mounted over a carrier 842, such as a substrate.

The elevated portion 408 of the encapsulation 404 functions as a spacer allowing package interconnects 844, such as bond wires or ribbon bond wires, to connect to the top side 410 of the leads 412 and the carrier 842. This eliminates the need for separate or discrete spacer structures thereby reducing manufacturing complexity, reducing the package profile, and lowering cost.

A package encapsulation 846, such as a cover of an epoxy molding compound, covers the stack of the integrated circuit package system 400 and the package interconnects 844 over the carrier 842. External interconnects 848, such as solder balls, can attach to the bottom of the carrier 842 for connection to the next system level (not shown), such as a printed circuit board or another integrated circuit package system.

For illustrative purposes, the lower of the integrated circuit package system 400 is shown connected to the carrier 842 with the package interconnects 844, although it is understood that the integrated circuit package system 400 may be connected to the carrier 842 differently. For example, conductive paste (not shown), such as solder paste, may be used to connect the bottom side 516 of the leads 412 and the carrier 842 or in combination with the package interconnects 844.

Figure 9:
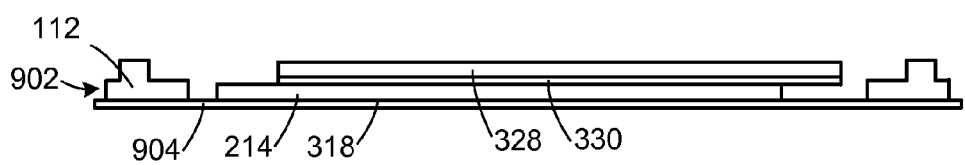
FIG. 9 is a cross-sectional view of a portion of a lead frame in a die attaching step of a portion the integrated circuit stack of FIG. 3.

Referring now to FIG. 9, therein is shown a cross-sectional view of a portion of a lead frame 902 in a die attaching step of a portion the integrated circuit stack 338 of FIG. 3. The cross-sectional view depicts the leads 112 as part of the lead frame 902 and attached with a mounting structure 904, such as a coverlay tape.

A portion of the integrated circuit stack 338 can be formed between the leads 112 with the bottom non-active side 318 of the bottom integrated circuit die 214 attached with the mounting structure 904. The first integrated circuit die 328 mounts over the bottom integrated circuit die 214 in an offset configuration.

Figure 10:
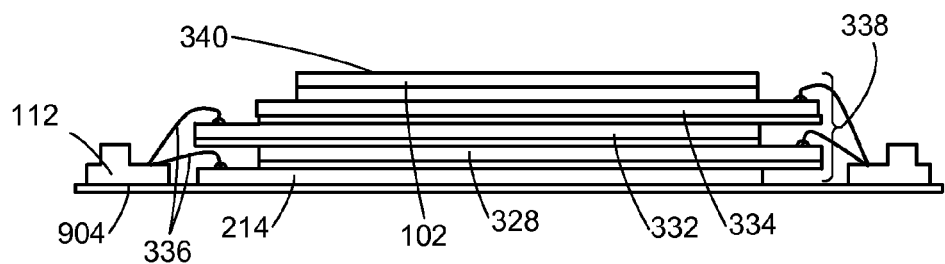
FIG. 10 is the structure of FIG. 9 in a connecting step of the internal interconnects.

Referring now to FIG. 10, therein is shown the structure of FIG. 9 in a connecting step of the internal interconnects 336. The internal interconnects 336 attach between the leads 112 and the bottom integrated circuit die 214. The internal interconnects 336 also attach between the leads 112 and the first integrated circuit die 328.

The second integrated circuit die 332 mounts over the first integrated circuit die 328 in an offset configuration in a similar direction to the bottom integrated circuit die 214. The third integrated circuit die 334 mounts over the second integrated circuit die 332 in an offset configuration in a similar direction to the first integrated circuit die 328. The top integrated circuit die 102 mounts over the third integrated circuit die 334. The adhesive 330 is between the integrated circuit dice in the integrated circuit stack 338. The top non-active side 340 of the top integrated circuit die 102 faces away from the mounting structure 904.

The internal interconnects 336 continue to attach between the leads 112 and both the second integrated circuit die 332 and the third integrated circuit die 334 in the integrated circuit stack 338. The offset configuration of the integrated circuit dice in the integrated circuit stack 338 provides clearance for the connection of the internal interconnects 336 with the integrated circuit stack 338.

Figure 11:
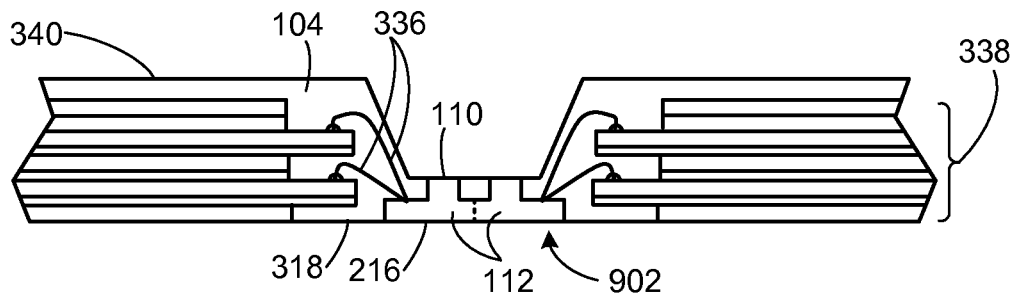
FIG. 11 is the structure of FIG. 10 in a forming step of the encapsulation.

Referring now to FIG. 11, therein is shown the structure of FIG. 10 in a forming step of the encapsulation 104. The cross-sectional view depicts portions of adjacent structures of FIG. 10 with the leads 112 still attached to each other from the adjacent structures in the lead frame 902. The encapsulation 104 is formed surrounding the internal interconnects 336 and the integrated circuit stack 338 in each of the adjacent structures. The top non-active side 340 and the bottom non-active side 318 are exposed from the encapsulation 104. The encapsulation 104 also exposes the top side 110 and the bottom side 216 of the leads 112.

The mounting structure 904 of FIG. 9 is removed from the encapsulated structure. The encapsulated structure can undergo post molding cure. The encapsulated structure can optionally be plated, such as with copper alloy, nickel/palladium, or gold alloy, and can undergo device marking.

Figure 12:
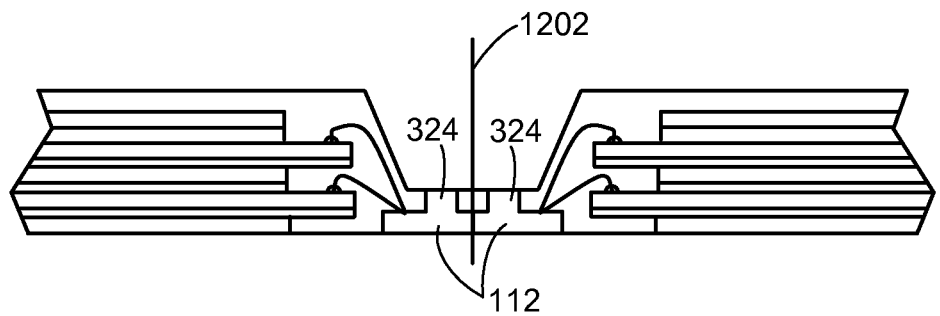
FIG. 12 is the structure of FIG. 11 in a singulating step of the integrated circuit package system of FIG. 3.

Referring now to FIG. 12, therein is shown the structure of FIG. 11 in a singulating step of the integrated circuit package system 100 of FIG. 3. A singulation element 1202, such as a saw, may cut the leads 112 that are attached without cutting the protrusion 324 forming the integrated circuit package system 100.

Figure 13:
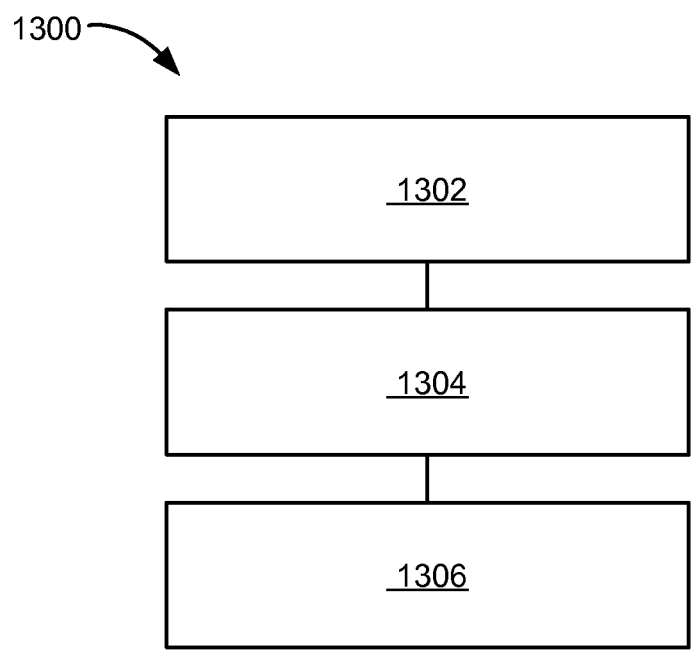
FIG. 13 is a flow chart of an integrated circuit package system for manufacturing of the integrated circuit package system in an embodiment of the present invention.

Referring now to FIG. 13, therein is shown a flow chart of an integrated circuit package system 1300 for manufacturing of the integrated circuit package system 100 in an embodiment of the present invention. The system 1300 includes forming an integrated circuit stack having a bottom non-active side and a top non-active side in a block 1302; connecting an internal interconnect between a lead, having a top side and a bottom side, and the integrated circuit stack in a block 1304; and forming an encapsulation, having both an non-elevated portion and an elevated portion, around the integrated circuit stack and the internal interconnect with the top side exposed at the non-elevated portion, and with the bottom side, the bottom non-active side, and the top non-active side exposed in a block 1306.

These and other valuable aspects of the present invention consequently further the state of the technology to at least the next level.

Thus, it has been discovered that the integrated circuit package-on-package stacking system of the present invention furnishes important and heretofore unknown and unavailable solutions, capabilities, and functional aspects for developing and manufacturing package-on-package stacked solutions. The resulting processes and configurations are straightforward, cost-effective, uncomplicated, highly versatile, and effective, can be surprisingly and unobviously implemented by adapting known technologies, and are thus readily suited for efficiently and economically manufacturing package-on-package stacked devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    forming an integrated circuit stack having a bottom non-active side and a top non-active side of a die;
    connecting an internal interconnect between a lead, having a top side and a bottom side, and the integrated circuit stack; and
    forming an unitary encapsulation, having both a non-elevated portion and an elevated portion, around the integrated circuit stack and the internal interconnect with the top side exposed at the non-elevated portion, and with the bottom side, the bottom non-active side, and the top non-active side exposed.

2. The method as claimed in claim 1 wherein forming the encapsulation includes covering a side of a protrusion of the lead with the protrusion including the top side.

3. The method as claimed in claim 1 wherein forming the encapsulation includes forming the elevated portion of the encapsulation above the top side of the lead.

4. The method as claimed in claim 1 wherein forming the integrated circuit stack includes forming the integrated circuit stack having integrated circuit dice in an offset configuration.

5. The method as claimed in claim 1 further comprising:
    mounting a further integrated circuit package system over the elevated portion of the encapsulation;

connecting a package interconnect between a carrier and the lead with the package interconnect in a clearance formed by the elevated portion; and forming a package encapsulation over the further integrated circuit package system, the package interconnect, and the carrier.

6. A method of manufacture of an integrated circuit package system comprising:

forming an integrated circuit stack, having a bottom non-active side and a top non-active side of a die, with integrated circuit dice in an offset configuration;

connecting an internal interconnect between a lead, having a top side and a bottom side, and the integrated circuit stack; and forming an encapsulation around the integrated circuit stack and the internal interconnect including:

forming the encapsulation having both an non-elevated portion and an elevated portion, exposing the top side exposed at the non-elevated portion, exposing the top non-active side at the elevated portion, and exposing the bottom side and the bottom non-active side from a bottom surface of the encapsulation.

7. The method as claimed in claim 6 wherein exposing the bottom side and the bottom non-active side at the bottom surface of the encapsulation includes attaching the internal interconnect in a clearance in the offset configuration in the integrated circuit stack.

8. The method as claimed in claim 6 wherein exposing the bottom side and the bottom non-active side at the bottom surface of the encapsulation includes forming the bottom surface coplanar with the bottom side.

9. The method as claimed in claim 6 wherein forming the encapsulation having the elevated portion includes forming the elevated portion above the top side.

10. The method as claimed in claim 6 wherein exposing the top non-active side includes exposing the top non-active side from a top surface of the encapsulation.

11. An integrated circuit package system comprising:

an integrated circuit stack having a bottom non-active side and a top non-active side of a die;

a lead, having a top side and a bottom side, adjacent to the integrated circuit stack;

an internal interconnect between the lead and the integrated circuit stack; and an encapsulation, having both a non-elevated portion and an elevated portion, around the integrated circuit stack and the internal interconnect with the top side exposed at the non-elevated portion, and with the bottom side, the bottom non-active side, and the top non-active side exposed.

12. The system as claimed in claim 11 wherein the lead includes a protrusion having the top side.

13. The system as claimed in claim 11 wherein the elevated portion of the encapsulation is above the top side of the lead.

14. The system as claimed in claim 11 wherein the integrated circuit stack includes integrated circuit dice in an offset configuration.

15. The system as claimed in claim 11 further comprising:
a carrier;
a further integrated circuit package system over the elevated portion of the encapsulation and the carrier;
a package interconnect between the carrier and the lead with the package interconnect in a clearance formed by the elevated portion; and
a package encapsulation over the further integrated circuit package system, the package interconnect, and the carrier.

16. The system as claimed in claim 11 wherein:
the integrated circuit stack includes integrated circuit dice in an offset configuration;
the top non-active side of the integrated circuit stack is exposed from the elevated portion, and
the bottom side and the bottom non-active side are exposed from a bottom surface of the encapsulation.

17. The system as claimed in claim 16 wherein the internal interconnect is in a clearance in the offset configuration in the integrated circuit stack.

18. The system as claimed in claim 16 wherein the bottom surface of the encapsulation is coplanar with the bottom side.

19. The system as claimed in claim 16 wherein the elevated portion of the encapsulation is above the top side.

20. The system as claimed in claim 16 wherein the top non-active side of the integrated circuit stack is exposed from a top surface of the encapsulation.

* * * * *